(12) United States Patent
Shank et al.

(10) Patent No.: US 11,862,511 B2
(45) Date of Patent: Jan. 2, 2024

(54) FIELD-EFFECT TRANSISTORS WITH A CRYSTALLINE BODY EMBEDDED IN A TRENCH ISOLATION REGION

(71) Applicant: GlobalFoundries U.S. Inc., Malta, NY (US)

(72) Inventors: Steven M. Shank, Jericho, VT (US); Siva P. Adusumilli, South Burlington, VT (US); Alvin Joseph, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/527,716

(22) Filed: Nov. 16, 2021

(65) Prior Publication Data

US 2023/0154786 A1 May 18, 2023

(51) Int. Cl.
*H01L 21/762* (2006.01)
*H01L 21/02* (2006.01)

(52) U.S. Cl.
CPC .. *H01L 21/76297* (2013.01); *H01L 21/02595* (2013.01)

(58) Field of Classification Search
None
See application file for complete search history.

(56) References Cited

U.S. PATENT DOCUMENTS

| 4,522,662 A | 6/1985 | Bradbury et al. |
| 4,670,088 A | 6/1987 | Tsaur et al. |
| 4,760,036 A | 7/1988 | Schubert |
| 4,948,456 A | 8/1990 | Schubert |
| 7,435,639 B2 | 10/2008 | Winstead et al. |
| 8,866,226 B2 | 10/2014 | Botula et al. |
| 10,192,779 B1 * | 1/2019 | Shank ................. H01L 29/0649 |
| 10,424,664 B2 | 9/2019 | Ellis-Monaghan |
| 10,453,928 B2 | 10/2019 | Kjar |
| 11,437,522 B2 * | 9/2022 | Abou-Khalil ..... H01L 29/78672 |

OTHER PUBLICATIONS

Shin, Dongjae et al., "III/V-on-bulk-Si technology for commercially viable photonics-integrated VLSI," 2020 Symposium on VLSI Technology Digest of Technical Papers, 978-1-7281-6460-1/20 IEEE, 2 pages (2020).

Gibbons, J.F. et al., "One-Gate-Wide CMOS Inverter on Laser-Recrystallized Polysilicon," IEE Electron Device Letters, vol. EDL-1, No. 6, pp. 117-118 (Jun. 1980).

Kim, Sang-Hoon et al., "In situ implementation of silicon epitaxial layer on amorphous SiO2 using reduced-pressure chemical vapor deposition," Applied Materials Today 24 101143, 7 pages (Sep. 2021).

* cited by examiner

*Primary Examiner* — Alexander G Ghyka
(74) *Attorney, Agent, or Firm* — Thompson Hine LLP; Francois Pagette

(57) ABSTRACT

Structures for a field-effect transistor and methods of forming a structure for a field-effect transistor. The structure includes a semiconductor substrate having a first trench, and a trench isolation region positioned in the first trench. The trench isolation region contains a dielectric material, the trench isolation region includes a second trench surrounded by the dielectric material, and the trench isolation region includes openings that penetrate through the dielectric material. A semiconductor layer is positioned in the second trench of the trench isolation region. The semiconductor layer contains a single-crystal semiconductor material.

20 Claims, 6 Drawing Sheets

FIELD-EFFECT TRANSISTORS WITH A CRYSTALLINE BODY EMBEDDED IN A TRENCH ISOLATION REGION

BACKGROUND

The present disclosure relates to semiconductor device fabrication and integrated circuits and, more specifically, to structures for a field-effect transistor and methods of forming a structure for a field-effect transistor.

Complementary-metal-oxide-semiconductor (CMOS) processes may be employed to build field-effect transistors, which may be implemented as, for example, a switch field-effect transistor. Field-effect transistors generally include a source, a drain, a channel region between the source and drain, and a gate electrode overlapped with the channel region. When a control voltage exceeding a characteristic threshold voltage is applied to the gate electrode, carrier flow occurs in the channel region between the source and drain to produce a device output current. A switch field-effect transistor may be used in communication devices, such as mobile phones, to route radiofrequency signals among different signal paths.

Improved structures for a field-effect transistor and methods of forming a structure for a field-effect transistor are needed.

SUMMARY

In an embodiment of the invention, a structure includes a semiconductor substrate having a first trench, and a trench isolation region positioned in the first trench. The trench isolation region comprises a dielectric material, the trench isolation region includes a second trench surrounded by the dielectric material, and the trench isolation region includes a plurality of openings that penetrate through the dielectric material. A semiconductor layer is positioned in the second trench of the trench isolation region. The semiconductor layer comprises a single-crystal semiconductor material.

In an embodiment of the invention, a method includes forming a trench isolation region in a first trench in a semiconductor substrate, forming a second trench in the trench isolation region that is surrounded by a dielectric material of the trench isolation region, forming a plurality of openings that penetrate through the dielectric material to the semiconductor substrate, and forming a semiconductor layer positioned in the second trench of the trench isolation region. The semiconductor layer comprises a single-crystal semiconductor material.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

FIG. 5A is a top view in which FIG. 5 is taken generally along line 5-5.

DETAILED DESCRIPTION

Figure 1:
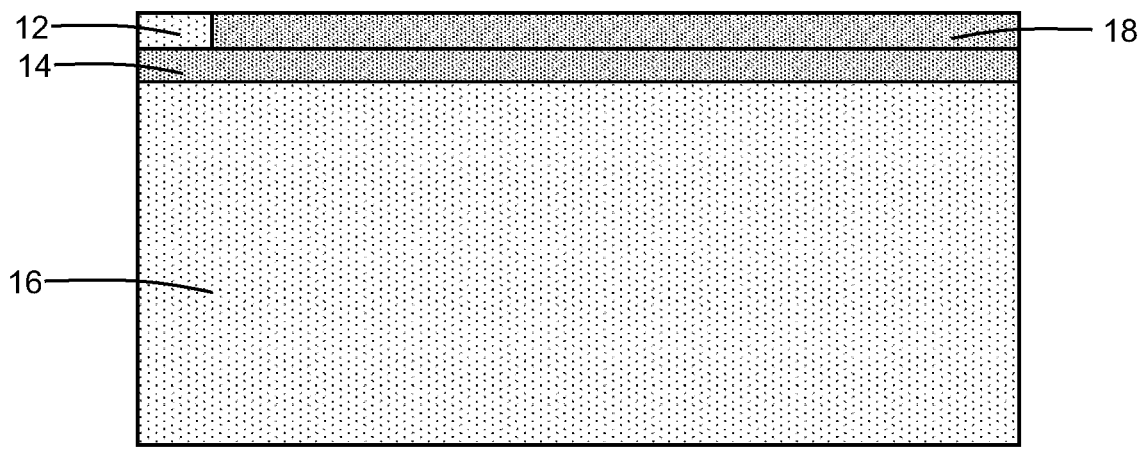
FIGS. 1-4 are cross-sectional views of a structure at successive fabrication stages of a processing method in accordance with embodiments of the invention.

With reference to FIG. 1 and in accordance with embodiments of the invention, a semiconductor-on-insulator substrate includes a device layer 12, a buried insulator layer 14, and a handle substrate 16. The device layer 12 is separated from the handle substrate 16 by the intervening buried insulator layer 14 and is considerably thinner than the handle substrate 16. The device layer 12 may be comprised of a semiconductor material, such as single-crystal silicon, and may be intrinsic or lightly doped p-type, and the buried insulator layer 14 may be comprised of a dielectric material, such as silicon dioxide, that is an electrical insulator. The buried insulator layer 14 has a lower surface in direct contact with the handle substrate 16 along an interface and an upper surface in direct contact with the device layer 12 along another interface, and the interfaces are separated by the thickness of the buried insulator layer 14. The device layer 12 is electrically isolated from the handle substrate 16 by the buried insulator layer 14. In an embodiment, the device layer 12 may have a thickness in a range of about 4 nanometers (nm) to about 100 nm, and the buried insulator layer 14 may have a thickness in a range of about 50 nm to about 250 nm.

A shallow trench isolation region 18 is formed in the device layer 12, and may extend fully through the device layer 12. The shallow trench isolation region 18 may be formed by patterning a trench extending through the device layer 12 with lithography and etching processes, depositing a dielectric material to fill the trench, and planarizing and/or recessing the dielectric material. The shallow trench isolation region 18 may contain a dielectric material, such as silicon dioxide, deposited by chemical vapor deposition and planarized by chemical-mechanical polishing.

Figure 2:
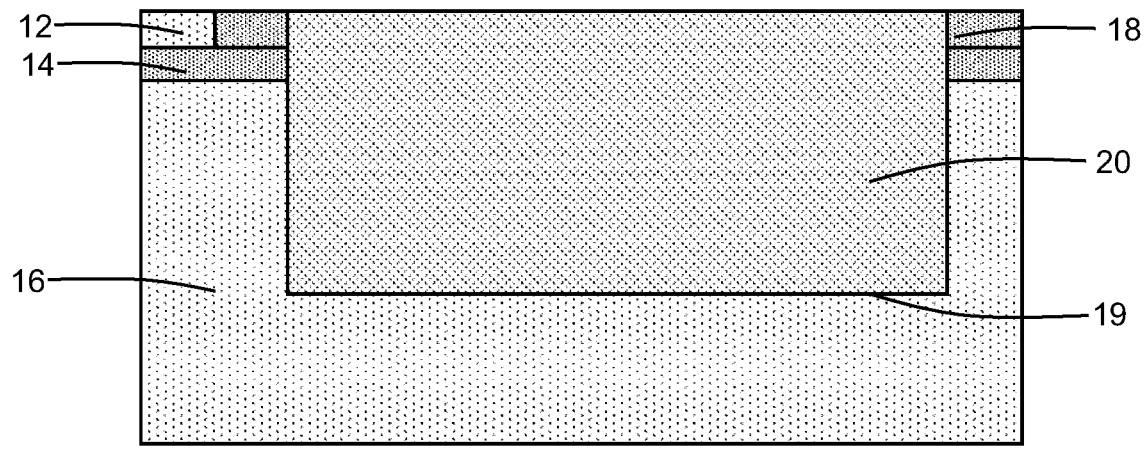

With reference to FIG. 2 in which like reference numerals refer to like features in FIG. 1 and at a subsequent fabrication stage of the processing method, a trench isolation region 20 is formed that penetrates through the shallow trench isolation region 18 and the buried insulator layer 14, and into the handle substrate 16. The trench isolation region 20 may be formed by patterning a trench 19 with lithography and etching processes, depositing a dielectric material to fill the trench 19, and planarizing and/or recessing the dielectric material. The trench isolation region 20 may contain a dielectric material, such as silicon dioxide, deposited by chemical vapor deposition and planarized by chemical-mechanical polishing.

Figure 3:
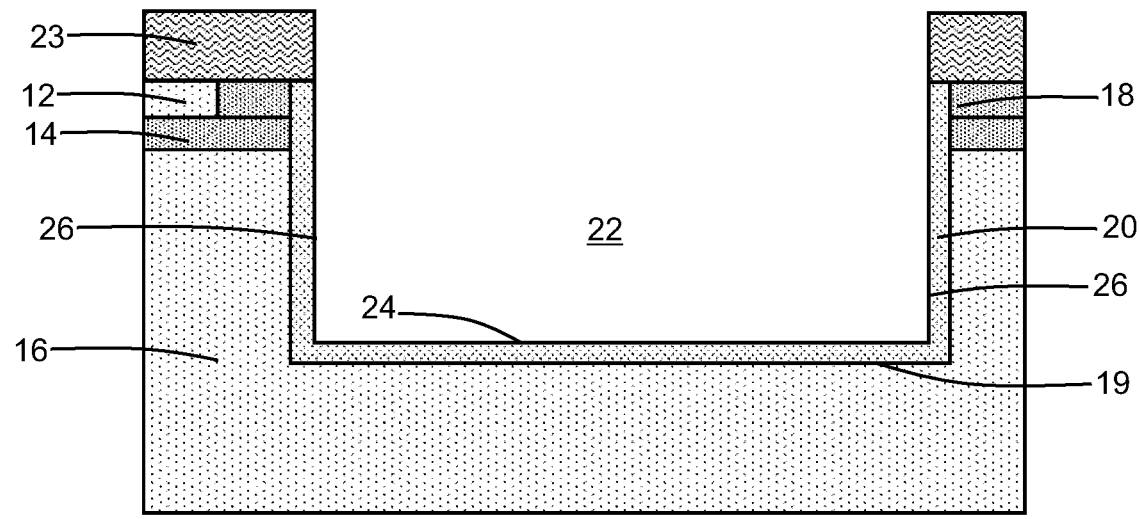

With reference to FIG. 3 in which like reference numerals refer to like features in FIG. 2 and at a subsequent fabrication stage of the processing method, a trench 22 is formed within the interior (i.e., inside the outer perimeter) of the trench isolation region 20. The trench 22 may be formed by patterning the dielectric material of the trench isolation region 20 with lithography and etching processes. To that end, an etch mask 23 is formed by a lithography process over the trench isolation region 20. The etch mask 23 includes an opening located at the intended location for the trench 22. The opening in the etch mask 23 has an area in a normal direction that is less than the surface area of the trench isolation region 20. An etching process, such as reactive ion etching, is employed to etch and remove the dielectric material of the trench isolation region 20 exposed by the opening in the etch mask 23.

The trench 22 includes a bottom 24 and sidewalls 26 that are fully surrounded by a thickness of the dielectric material of the trench isolation region 20. The etching process is controlled (e.g., timed) to penetrate only partially through the thickness of the trench isolation region 20. As a result, a thickness of the dielectric material of the trench isolation region 20 is arranged as a lower margin between the bottom 24 of the trench 22 and the handle substrate 16. The lateral dimensions of the trench 22 are less than the lateral dimensions of the trench isolation region 20. As a result, a thickness of the dielectric material of the trench isolation region 20 is arranged as a lateral margin between the sidewalls 26 of the trench 22 and the handle substrate 16 and surrounding the sidewalls 26 of the trench 22.

Figure 4:
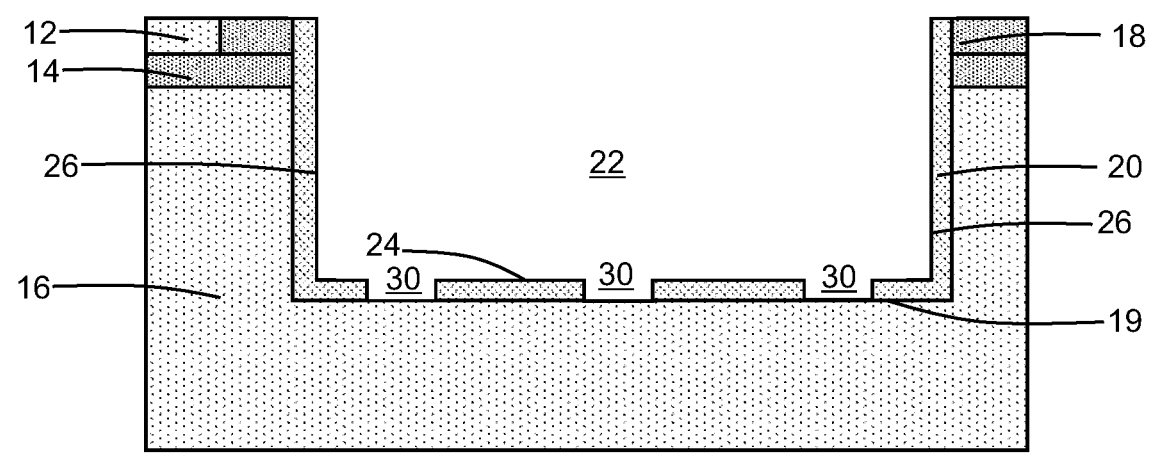

With reference to FIG. 4 in which like reference numerals refer to like features in FIG. 3 and at a subsequent fabrication stage of the processing method, openings 30 are formed that penetrate fully through the dielectric material of the trench isolation region 20 at the bottom 24 of the trench 22 to the handle substrate 16. The openings 30 may be formed by patterning the dielectric material of the trench isolation region 20 at the bottom 24 of the trench 22 with lithography and etching processes. The openings 30 extend from the trench 19 to the trench 22 such that open paths exist between the interior of the trench 22 and the handle substrate 16. The openings 30 may be rectangular trenches or may have another suitable geometrical shape.

Figure 5:
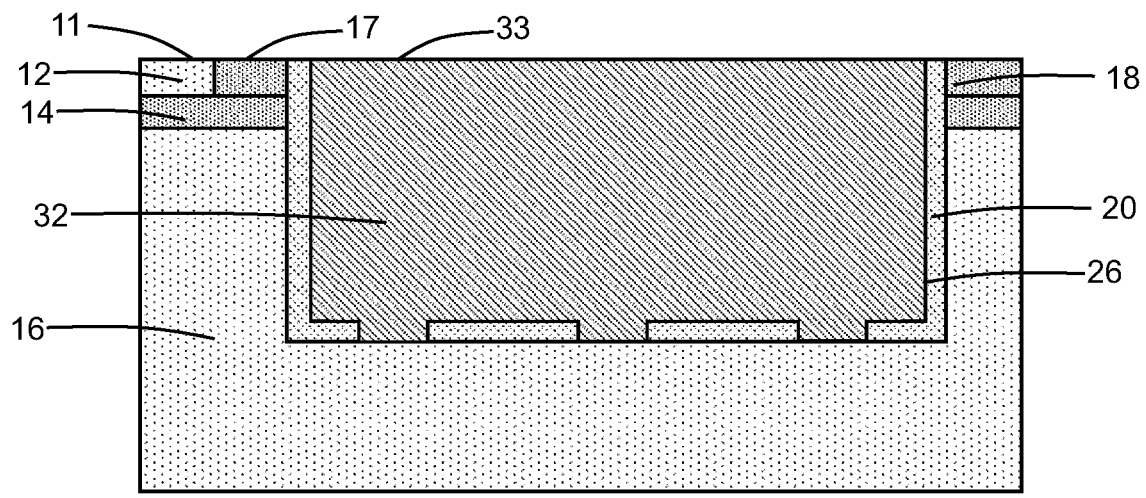
FIG. 5 is a cross-sectional view of the structure at a fabrication stage subsequent to FIG. 4.
Figure 5A:
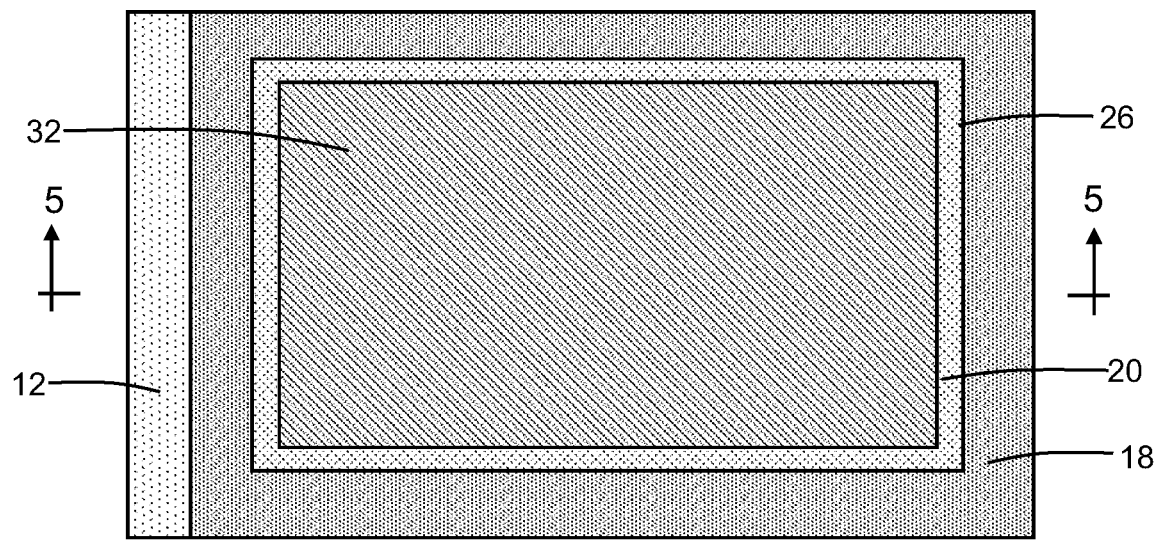

With reference to FIGS. 5, 5A in which like reference numerals refer to like features in FIG. 4 and at a subsequent fabrication stage of the processing method, a semiconductor layer 32 is formed inside the trench 22 after the openings 30 are formed. The semiconductor layer 32 may be comprised of a single-crystal semiconductor material, such as single-crystal silicon, that is monocrystalline with a defect density less than a threshold defect level. In an embodiment, the semiconductor layer 32 may be undoped to provide a high electrical resistivity. In an embodiment, the semiconductor layer 32 may contain single-crystal semiconductor material having an electrical resistivity in range of about 1,000 ohm-cm to about 50,000 ohm-cm.

The semiconductor layer 32 may be formed using an epitaxial growth process to grow single-crystal semiconductor material (e.g., single-crystal silicon) that is subsequently planarized by chemical-mechanical polishing. The semiconductor layer 32 may be formed by a selective epitaxial growth process in which process conditions are selected to cause the semiconductor material to selectively grow from exposed semiconductor material but not from exposed dielectric material. The portions of the handle substrate 16 accessible through the openings 30 provide seed windows during epitaxial growth and collectively serve as a crystalline template for the crystal structure of the epitaxially-grown semiconductor layer 32.

The semiconductor layer 32 is effectively positioned inside a tub of dielectric material provided by the dielectric material margins of the patterned trench isolation region 20. The tub of dielectric material contributes to electrically isolating the semiconductor layer 32 from the handle substrate 16. The semiconductor layer 32 may include a top surface 33 that is either coplanar or substantially coplanar, following planarization, with a top surface 17 of the shallow trench isolation region 18 and/or with a top surface 11 of the device layer 12. Portions of the semiconductor layer 32, which contain single-crystal semiconductor material, are positioned as pillars inside the openings 30.

Figure 6:
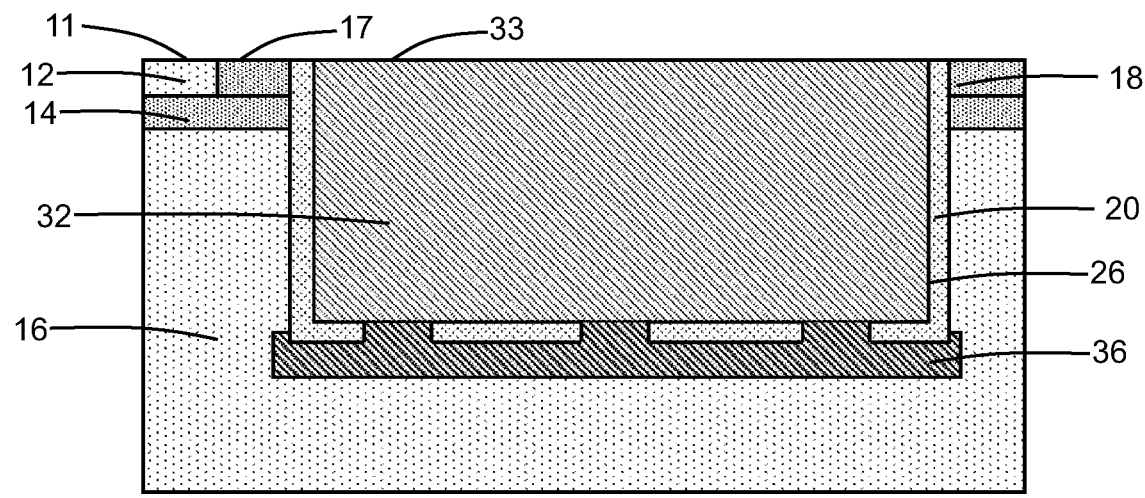
FIGS. 6-7 are cross-sectional views of the structure at fabrication stages subsequent to FIG. 5.

With reference to FIG. 6 in which like reference numerals refer to like features in FIG. 5 and at a subsequent fabrication stage of the processing method, a polycrystalline layer 36 containing polycrystalline semiconductor material (e.g., polysilicon) may be formed in the handle substrate 16 beneath the trench isolation region 20. In the representative embodiment, the semiconductor layer 32 inside the openings 30 and a lower portion of the semiconductor layer 32 adjacent to the bottom 24 of the trench 22 may be converted to polycrystalline semiconductor material when the polycrystalline layer 36 is formed. In an alternative embodiment, the portions of the semiconductor layer 32 inside the openings 30 may contain single-crystal semiconductor material.

The polycrystalline semiconductor material in the polycrystalline layer 36 and the polycrystalline semiconductor material formed in the semiconductor layer 32 may contain polycrystalline grains of semiconductor material, as well as other defects. The polycrystalline semiconductor material may be characterized as a trap-rich material that is capable of efficiently capturing charge carriers and provides additional electrical isolation between the semiconductor layer 32 and the handle substrate 16. In that regard, the polycrystalline semiconductor material may have an electrical resistivity that is greater than or equal to the electrical resistivity of the handle substrate 16. In an embodiment, the polycrystalline semiconductor material may have an electrical resistivity that is greater than or equal to 1,000 ohm-cm. In an embodiment, the electrical resistivity of the polycrystalline semiconductor material may be within a range of 1,000 ohm-cm to 10,000 ohm-cm.

The polycrystalline semiconductor material in the polycrystalline layer 36 and the polycrystalline semiconductor material formed in the semiconductor layer 32 may be formed by a sequence of ion implantation and annealing processes. The ion implantation process, which may utilize an implantation mask and argon ions, causes damage to the crystal structure of the semiconductor material. An annealing process (e.g., a rapid thermal anneal) may be used to recrystallize the damaged semiconductor material. The conditions for the ion implantation may be adjusted to control the spatial extent and boundaries of the polycrystalline semiconductor material.

Figure 7:
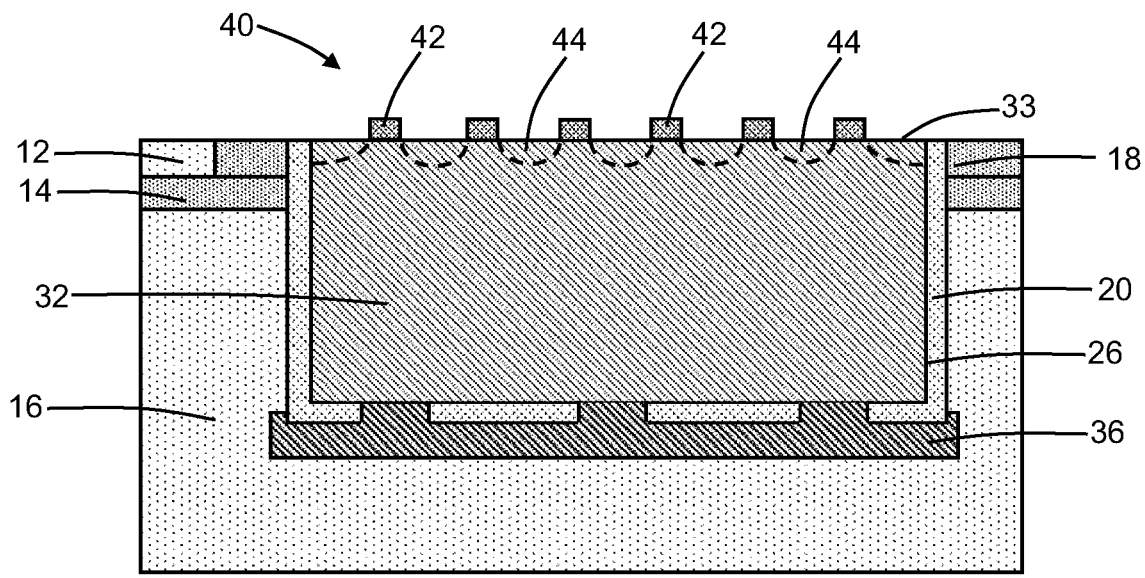

With reference to FIG. 7 in which like reference numerals refer to like features in FIG. 6 and at a subsequent fabrication stage of the processing method, a switch field-effect transistor 40 may be fabricated by front-end-of-line processing as a device structure in the semiconductor layer 32. The switch field-effect transistor 40 may include gates 42 over the top surface 33 of the semiconductor layer 32 and source/drain regions 44 that are formed in the semiconductor layer 32. The gates 42 may be formed, for example, as gate fingers by patterning a deposited layer of heavily-doped polysilicon, and the source/drain regions 44 may be formed by ion implantation or diffusion of, for example, an n-type dopant. The switch field-effect transistor 40 may include other elements, such as a gate dielectric between the gates 42 and the semiconductor layer 32, halo regions, and extension regions. In an embodiment, the switch field-effect transistor 40 may be configured to switch signal paths in a radiofrequency integrated circuit.

Middle-of-line processing and back-end-of-line processing follow, which includes formation of contacts, vias, and wiring for an interconnect structure that is coupled to the switch field-effect transistor 40.

In an alternative embodiment, the semiconductor substrate may be a bulk substrate comprised of a single-crystal semiconductor material, such as single-crystal silicon. The trench isolation region 20 is bordered by the single-crystal semiconductor of the bulk substrate, and the dielectric material of the trench isolation region 20 is arranged between the semiconductor layer 32 and the bulk substrate other than at the locations of the openings 30.

The semiconductor layer 32 defines a single-crystal semiconductor body that is embedded inside the dielectric material of the patterned trench isolation region 20 (i.e., inside a tub of dielectric material). The device layer 12, the trench isolation region 20, and the semiconductor layer 32 may have coplanar or substantially coplanar upper or top surfaces 11, 17, 33. The openings 30 provide seed windows during epitaxial growth and are arranged between the handle substrate 16 and the semiconductor body defined by the semiconductor layer 32. The polycrystalline layer 36 provides high-resistivity polysilicon in the handle substrate 16 underneath the trench isolation region 20 and between the single-crystal semiconductor material of the semiconductor layer 32 and the handle substrate 16. The polycrystalline semiconductor material of the semiconductor layer 32 inside the seed windows also provides high-resistivity polysilicon between the single-crystal semiconductor material of the semiconductor layer 32 and the handle substrate 16. In an embodiment, the switch field-effect transistor 40 may be formed using the single-crystal semiconductor material as a device structure in an upper portion of the semiconductor layer 32. The dielectric material of the trench isolation region 20 surrounding the semiconductor layer 32, as well as the polycrystalline semiconductor material in the polycrystalline layer 36 and the polycrystalline semiconductor material formed in the semiconductor layer 32, may contribute to reducing harmonic distortion at small channel lengths during operation of the switch field-effect transistor 40. The linearity, off-capacitance, electrical isolation, occupied chip area, electrostatic discharge performance, and latch-up performance of the switch field-effect transistor 40 may also be improved during operation.

Figure 8:
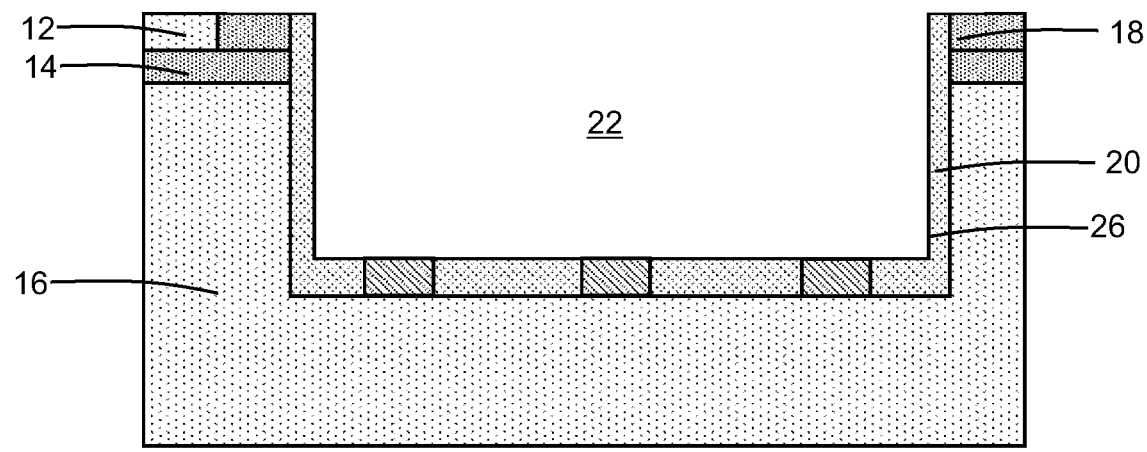
FIGS. 8-9 are cross-sectional views of a structure at successive fabrication stages of a processing method in accordance with alternative embodiments of the invention.

With reference to FIG. 8 in which like reference numerals refer to like features in FIG. 4 and in accordance with alternative embodiments of the invention, the single-crystal semiconductor material of the semiconductor layer 32 may be initially formed only inside the openings 30. The semiconductor material inside each opening 30 defines an initial pillar of single-crystal semiconductor material extending away from the handle substrate 16.

Figure 9:
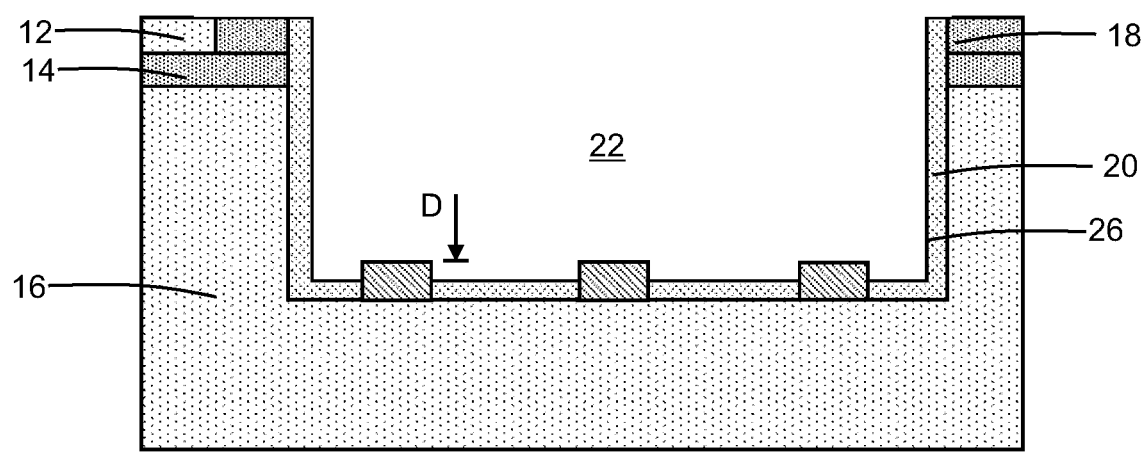

With reference to FIG. 9 in which like reference numerals refer to like features in FIG. 8 and at a subsequent fabrication stage of the processing method, the dielectric material of the trench isolation region 20 between the bottom 24 of the trench 22 and the handle substrate 16 may be thinned, but not removed, by performing an etching process. The etching process may remove the dielectric material of the trench isolation region 20 selective to the single-crystal semiconductor material of the semiconductor layer 32 arranged as pillars inside the openings 30. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. As a result, a portion of the pillar of semiconductor material inside each opening 30 projects by a distance D above the dielectric material of the trench isolation region 20 at the bottom 24 of the trench 22.

The semiconductor layer 32 is subsequently formed inside the remainder of the trench 22 by an epitaxial growth process as previously described. The pillars inside the openings 30 in the thinned trench isolation region 20 provide growth seeds for the epitaxial growth process, and epitaxial growth may initially proceed laterally from the different pillars and then merge into a single mass as the trench 22 is filled by semiconductor material. Processing may continue to form the polycrystalline layer 36 and the switch field-effect transistor 40.

Figure 10:
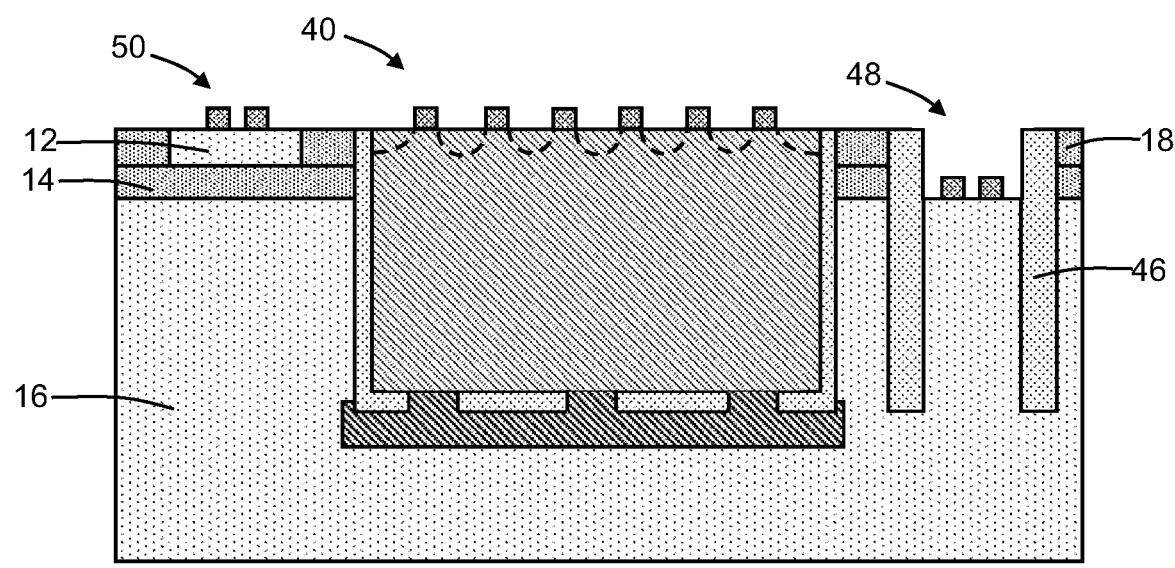
FIG. 10 is a cross-sectional view of a structure in accordance with alternative embodiments of the invention.

With reference to FIG. 10 and in accordance with alternative embodiments of the invention, deep trench isolation regions 46 may be formed that surround a region of the semiconductor-on-insulator substrate. The deep trench isolation regions 46 may be formed when the trench isolation region 20 is formed. The device layer 12 and buried insulator layer 14 may be removed from the surrounded region to expose the handle substrate 16, and a device structure 48, such as a low-noise amplifier or a power amplifier, may be formed using the exposed handle substrate 16. A device structure 50, such as a fully-depleted field-effect transistor, may be formed using the device layer 12 in a different region of the semiconductor-on-insulator substrate. The device structures 48, 50 are formed on the same substrate as the switch field-effect transistor 40.

The dielectric material of the trench isolation region 20 at the bottom 24 of the trench 22 may be multiple times (e.g., 3 times to 5 times) thicker than the buried insulator layer 14 because the switch field-effect transistor 40 may require a greater thickness of electrical insulator than the device structure 50 to provide adequate electrical isolation from the handle substrate 16. In an embodiment, the switch field-effect transistor 40 may be connected through the interconnect structure to the device structure 48.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected"

or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate including a device layer, a buried insulator layer, a handle substrate separated from the device layer by the buried insulator layer, and a first trench that penetrates through the device layer and the buried insulator layer into the handle substrate;
   a trench isolation region positioned in the first trench, the trench isolation region comprising a dielectric material, the trench isolation region including a second trench surrounded by the dielectric material, and the trench isolation region including a plurality of openings that penetrate through the dielectric material to the handle substrate; and
   a semiconductor layer positioned in the second trench of the trench isolation region, the semiconductor layer comprising a single-crystal semiconductor material.

2. The structure of claim 1 wherein the semiconductor substrate comprises polycrystalline semiconductor material beneath the trench isolation region.

3. The structure of claim 1 wherein the semiconductor layer includes a portion inside each of the plurality of openings, and the portion inside each of the plurality of openings comprises a polycrystalline semiconductor material.

4. The structure of claim 1 wherein the semiconductor layer includes a portion inside each of the plurality of openings, and the portion inside each of the plurality of openings comprises the single-crystal semiconductor material.

5. The structure of claim 1 wherein the device layer includes a top surface, and the semiconductor layer includes a top surface that is substantially coplanar with the top surface of the device layer.

6. The structure of claim 1 wherein the semiconductor layer includes a top surface, and further comprising:
   a shallow trench isolation region in the device layer, the shallow trench isolation region including a top surface, and the top surface of the shallow trench isolation region substantially coplanar with the top surface of the semiconductor layer.

7. The structure of claim 1 wherein the second trench includes a plurality of sidewalls and a bottom, the plurality of openings penetrate through the dielectric material of the trench isolation region at the bottom of the second trench, and the trench isolation region at the bottom of the second trench is 3 times to 5 times thicker than the buried insulator layer.

8. The structure of claim 1 further comprising:
   a switch field-effect transistor including a gate over the semiconductor layer and a source/drain region in the semiconductor layer.

9. The structure of claim 1 wherein the second trench includes a plurality of sidewalls and a bottom, and the plurality of openings penetrate through the dielectric material of the trench isolation region at the bottom of the second trench.

10. The structure of claim 9 wherein the plurality of openings extend between the first trench and the second trench.

11. The structure of claim 1 wherein the single-crystal semiconductor material of the semiconductor layer has an electrical resistivity in range of about 1,000 ohm-cm to about 50,000 ohm-cm.

12. A method comprising:
    forming a trench isolation region in a first trench in a semiconductor substrate, wherein the semiconductor substrate includes a device layer, a buried insulator layer, and a handle substrate separated from the device layer by the buried insulator layer, and the first trench penetrates through the device layer and the buried insulator layer into the handle substrate;
    forming a second trench in the trench isolation region that is surrounded by a dielectric material of the trench isolation region;
    forming a plurality of openings that penetrate through the dielectric material to the handle substrate; and
    forming a semiconductor layer positioned in the second trench of the trench isolation region, wherein the semiconductor layer comprises a single-crystal semiconductor material.

13. The method of claim 12 wherein forming the semiconductor layer positioned in the second trench of the trench isolation region comprises:
    epitaxially growing the single-crystal semiconductor material of the semiconductor layer from portions of the semiconductor substrate exposed through the plurality of openings.

14. The method of claim 13 further comprising:
    forming a layer of polycrystalline semiconductor material in the semiconductor substrate beneath the trench isolation region after the semiconductor layer is epitaxially formed.

15. The method of claim 13 wherein the semiconductor layer includes a portion inside each of the plurality of openings, and further comprising:
    converting the portion of the semiconductor layer inside each of the plurality of openings from the single-crystal semiconductor material to a polycrystalline semiconductor material after the semiconductor layer is epitaxially formed.

16. The method of claim 12 wherein forming the semiconductor layer positioned in the second trench of the trench isolation region comprises:
    epitaxially growing a pillar of the single-crystal semiconductor material inside each opening;
    thinning the dielectric material of the trench isolation region such that each pillar includes a portion that projects above the dielectric material; and epitaxially growing the single-crystal semiconductor material of the semiconductor layer from the portion of each pillar.

17. The method of claim 12 further comprising:

forming a shallow trench isolation region in the device layer, wherein the shallow trench isolation region includes a top surface, and the top surface of the semiconductor layer is substantially coplanar with the top surface of the shallow trench isolation region.

18. The method of claim 12 wherein the second trench includes a plurality of sidewalls and a bottom, the plurality of openings penetrate through the dielectric material of the trench isolation region at the bottom of the second trench, and the trench isolation region at the bottom of the second trench is 3 times to 5 times thicker than the buried insulator layer.

19. The structure of claim 1 wherein the second trench includes a bottom, and the plurality of openings penetrate through the dielectric material of the trench isolation region at the bottom of the second trench to extend from the second trench to the first trench.

20. The method of claim 12 further comprising:

forming a switch field-effect transistor including a gate over the semiconductor layer and a source/drain region in the semiconductor layer.

* * * * *